(12) United States Patent
Sarda

(10) Patent No.: US 11,595,032 B2
(45) Date of Patent: Feb. 28, 2023

(54) SIGNAL DELAY CONTROL USING A RECIRCULATING DELAY LOOP AND A PHASE INTERPOLATOR

(71) Applicant: Skyworks Solutions, Inc., Irvine, CA (US)

(72) Inventor: Vivek Sarda, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/332,365

(22) Filed: May 27, 2021

(65) Prior Publication Data

US 2022/0385281 A1 Dec. 1, 2022

(51) Int. Cl.
*H03K 5/14* (2014.01)
*H03K 5/135* (2006.01)
*H03K 5/00* (2006.01)

(52) U.S. Cl.
CPC .............. *H03K 5/14* (2013.01); *H03K 5/135* (2013.01); *H03K 2005/00052* (2013.01)

(58) Field of Classification Search
CPC ........ H03K 5/131; H03K 5/133; H03K 5/135; H03K 5/13; H03K 5/14; H03K 2005/00052; H03K 2005/00058; H03L 7/0812; H03L 7/0814; H03L 7/0816; H03L 7/0818; H03L 7/0807; H03L 7/081; H03L 7/07; H03L 7/0805; H03L 7/089
See application file for complete search history.

(56) References Cited

U.S. PATENT DOCUMENTS

| | | | |
|---|---|---|---|
| 4,458,165 A | 7/1984 | Jackson | |
| 4,805,195 A | 2/1989 | Keegan | |
| 7,126,404 B1 * | 10/2006 | Rosen | H03L 7/0814 327/292 |
| 7,417,510 B2 | 8/2008 | Huang | |
| 7,620,839 B2 * | 11/2009 | Chen | G06F 1/12 713/500 |
| 8,310,292 B1 * | 11/2012 | Phan | H03L 7/0814 327/158 |
| 9,362,936 B1 | 6/2016 | Caffee et al. | |

(Continued)

OTHER PUBLICATIONS

International Search Report and Written Opinion dated Sep. 6, 2022, in PCT/US2022/031057, 11 pages.

*Primary Examiner* — John W Poos
(74) *Attorney, Agent, or Firm* — Knobbe, Martens, Olson & Bear, LLP

(57) ABSTRACT

A delay circuit provides a programmable delay and includes an input selector circuit to select between a loop delay output signal and an input signal. A loop delay circuit provides a loop delay to the input signal and supplies the loop delay output signal. The input signal can be recirculated through the loop delay circuit to extend the range of the delay. The input selector circuit selects the feedback signal during recirculation. A variable delay circuit provides a variable delay to the loop delay output signal after the recirculation is complete and supplies a variable delay output signal. An output selector circuit selects the output of the output selector circuit during the recirculation and selects the variable delay output signal after the recirculation is complete to thereby provide a delayed signal with the delay based on the loop delay, the number of loops of recirculation, and the variable delay.

26 Claims, 8 Drawing Sheets

(56) References Cited

U.S. PATENT DOCUMENTS

| | | | |
|---|---|---|---|
| 9,531,394 B1 | 12/2016 | Caffee et al. | |
| 9,825,618 B2 * | 11/2017 | Wu | H03K 19/1737 |
| 10,067,478 B1 | 9/2018 | Ranganathan | |
| 10,491,201 B2 * | 11/2019 | Todorokihara | H03K 21/10 |
| RE48,275 E | 10/2020 | Caffee et al. | |
| 2005/0248377 A1 | 11/2005 | Drexler et al. | |
| 2011/0216864 A1 | 9/2011 | Kim et al. | |
| 2016/0211835 A1 | 7/2016 | Wu et al. | |

* cited by examiner

SIGNAL DELAY CONTROL USING A RECIRCULATING DELAY LOOP AND A PHASE INTERPOLATOR

BACKGROUND

Field of the Invention

This invention relates to network timing and more particularly to aligning signals to account for delay variations.

Description of the Related Art

Network communication often require that related signals be synchronized to each other. However, different signals using, e.g., different printed circuit board (PCB) traces and using different buffers can affect synchronization and lead to timing errors. Accordingly, better ways to address such timing errors would be desirable.

SUMMARY OF EMBODIMENTS OF THE INVENTION

Accordingly, in order to reduce timing errors, embodiments adjust the timing of output signals so that they are better aligned when arriving at a destination. In one embodiment, a delay circuit includes an input selector circuit to select between a feedback signal and an input signal. A loop delay circuit provides a loop delay to the input signal and supplies a loop delay output signal, which is also used as the feedback signal. The input selector circuit is controlled to select the feedback signal during recirculation of the feedback signal. A variable delay circuit provides a variable delay to the loop delay output signal after the recirculation is complete and supplies a variable delay output signal. An output selector circuit selects between an output of the output selector circuit and the variable delay output signal. The output selector circuit is controlled to select the output of the output selector circuit during the recirculation and to select the variable delay output signal after the recirculation is complete.

In another embodiment, a method includes selecting an input signal in an input selector circuit and recirculating the input signal in a loop delay circuit having a loop delay to thereby generate a first delayed signal that is delayed by (N×the loop delay), where N is an integer of 1 or more. The input selector circuit selects a feedback signal instead of the input signal during the recirculating. The first delayed signal is delayed by a variable delay in a variable delay circuit to generate a second delayed signal. An output selector circuit selects an output of the output selector circuit during the recirculating and after the recirculating is completed, selects the second delayed signal as an output of the output selector circuit.

In another embodiment, a delay circuit includes an input selector circuit to select between a feedback signal and an input signal. A fixed delay circuit is coupled to the input selector circuit and is configured to supply a fixed delay output signal, the fixed delay output signal is also the feedback signal. Control logic causes the input selector circuit to select the feedback signal during recirculation of the fixed delay output signal through the fixed delay circuit. A variable delay circuit is coupled to the fixed delay circuit to provide a variable delay to the fixed delay output signal after the recirculation is completed. An output selector circuit selects an output signal of the output selector circuit during the recirculation and selects an output of the variable delay circuit after the recirculation is complete.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
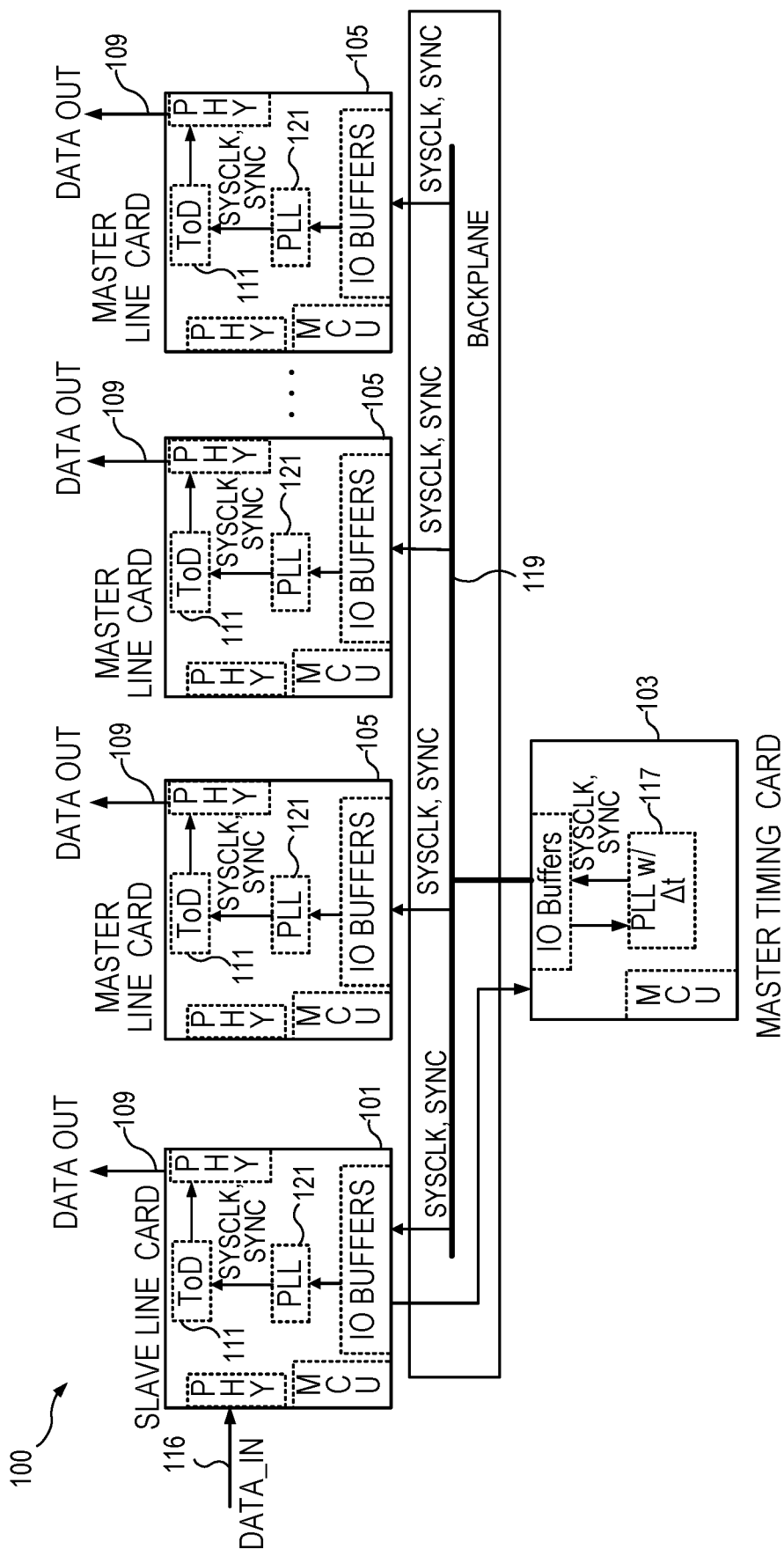
FIG. 1 illustrates a typical communication network box with a slave line card (LC), a master timing card (TC), and multiple master line cards coupled through a backplane.

FIG. 1 shows a typical architecture of communication network system 100 with a slave line card (LC) 101, a master timing card (TC) 103, and multiple master line cards 105. The data_out 109 from each line card is time stamped using time stamps from local Time of Day (ToD) counters 111. One challenge is to keep the ToD on the slave line card in alignment with the network timestamps from the incoming data stream on data_in 116. Another challenge is to maintain the ToD counters across different line cards in alignment over process, voltage, and temperature (PVT) variations so that the time stamps provided for data_out 109 are aligned with each other and the incoming network time supplied on data_in 116.

The master timing card 103 supplies a SYNC signal and system clock signal (SYSCLK) to the slave line card 101 generated using PLL 117 and dividers (not shown). The SYNC signal is also referred to as the FSYNC (frame sync) signal in certain contexts as the signal has different names (SYNC or F SYNC) at the system level or integrated circuit level inside the network box. The master timing card 103 also supplies the SYSCLK and SYNC signal to all of the master line cards 105 over backplane 119. The SYNC signal is a global signal inside the network system 100 that signifies the right moment/edge for the Time of Day (ToD) counters 111 to rollover. The SYNC signal has a frequency range of, e.g., 1 kHz to pp2s (pulse per 2 seconds). In many network systems the SYNC signal is 1 pulse per second (1PPS). SYNC is an integer divided down and edge aligned version of the system clock signal SYSCLK. The SYNC output from the master timing card (TC) is the global SYNC used by all the line cards (LC) for their ToD rollover alignment. The various ToD counters 111 contain the same value and turnover at the same time based on the SYNC signal. Each of the line cards 101 and 105 generate the SYNC signal by dividing the SYSCLK generated by PLL 121 in a divider (not shown in FIG. 1) to the desired frequency.

Figure 2:
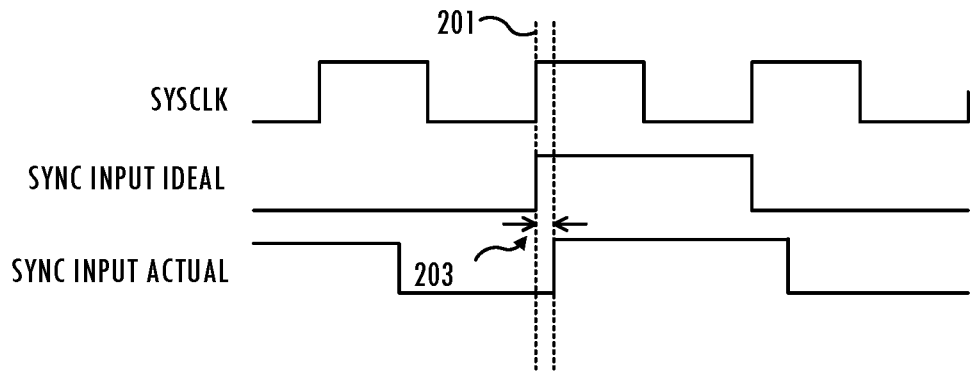
FIG. 2 illustrates misalignment that can occur between SYNC and SYSCLK signals.

However, related signals such as SYNC and SYSCLK can become misaligned due to, e.g., different PCB trace lengths and/or use of different buffers for the signals. Thus, the SYSCLK input signal and SYNC input signal received at a line card may be misaligned. In addition, the timing card may supply multiple SYSCLK signals and multiple SYNC signals, with each SYSCLK signal and SYNC signal going to a different group of line cards. There may be skew between the various SYSCLK signals and between the various SYNC signals. With reference to FIG. 2, ideally, each SYNC input signal received at a line card is perfectly aligned at 201 with the corresponding SYSCLK input signal. However, due to variations in delays associated with transmit and receive buffers and the backplane traces, the actual SYNC input signal received at the line card may be misaligned with respect to the SYSCLK as shown at 203.

In order to address such misalignment, embodiments herein provide output delay adjustments to eliminate known misalignments. Such known misalignments may be based on, e.g., pre-measured PCB trace mismatch. Such misalignment can be addressed once at startup or periodically based, e.g., on a temperature change being greater than a threshold or another system event such as replacement of one or more line cards.

Figure 3:
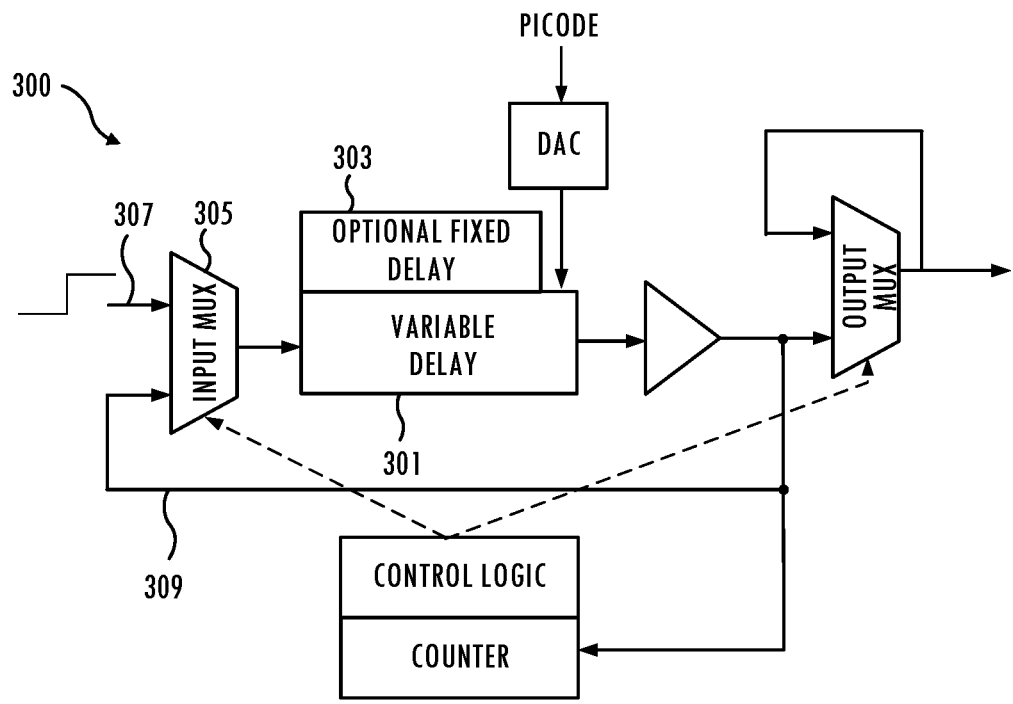
FIG. 3 illustrates a high level block diagram of an embodiment of a delay circuit for delaying an output signal by a programmable amount.

FIG. 3 shows a high level block diagram of an embodiment of a delay circuit 300 for delaying an output signal by a programmable amount. The delay circuit 300 provides both a programmable variable delay 301 and an optional fixed delay 303. The fixed delay 303 provides a coarse delay and the variable delay provides a fine delay. An input multiplexer 305 receives an input signal 307, e.g., from PLL 117 in FIG. 1. The edge of the input signal, shown as a rising edge in FIG. 3, is delayed in the delay circuit by both the coarse delay and the variable delay. In order to achieve a larger range of delay, the delayed signal is recirculated through the delay circuit by having the multiplexer 305 select the feedback signal 309. For example, assume that the fixed delay is 20 ps and the programmable fine delay is programmable between 0 and 25 ps. Assume the desired delay is 63 ps. Achieving the desired total delay requires 3 loops through the delay circuit to achieve a 60 ps coarse delay and then a 3 ps fine delay through the variable delay circuit 301 to achieve the 63 ps delay.

Figure 4A:
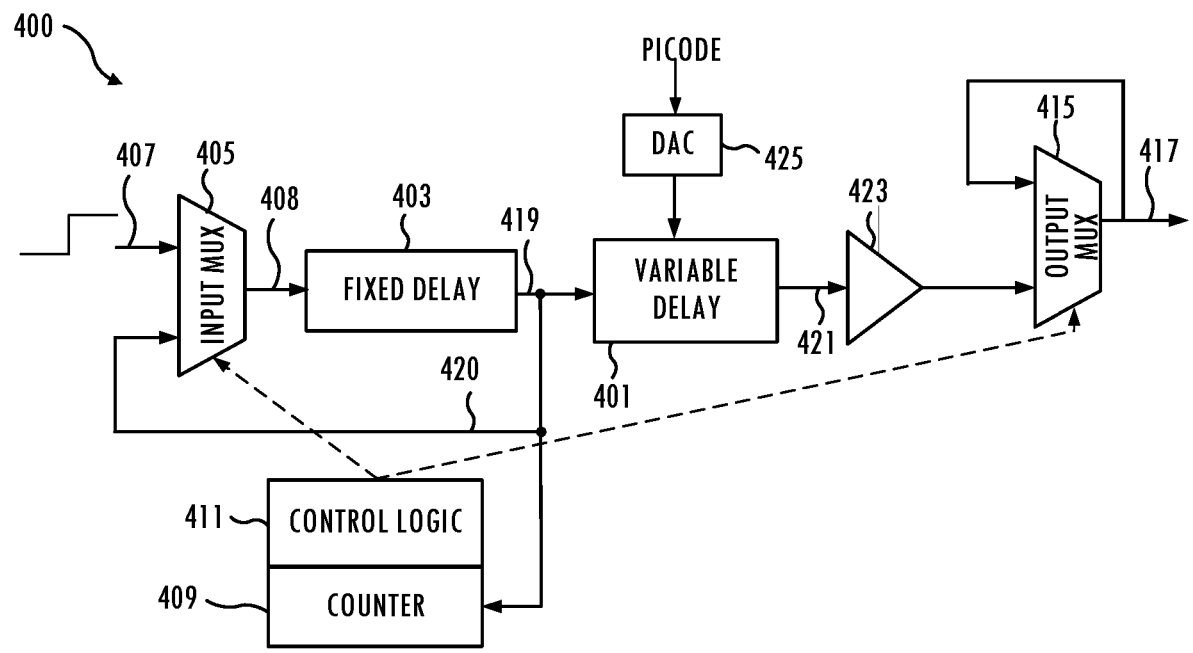
FIG. 4A illustrates an embodiment of a delay circuit 400 with a variable delay circuit and a fixed delay circuit.
Figure 4B:
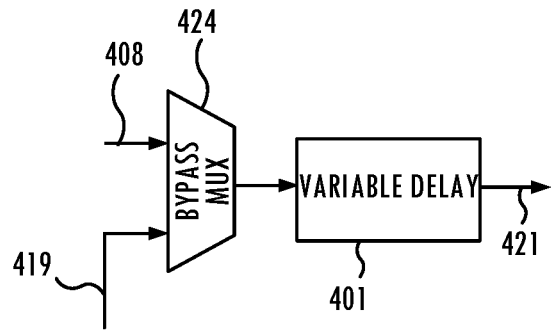
FIG. 4B illustrates how the fixed delay circuit can be bypassed.
Figure 4C:
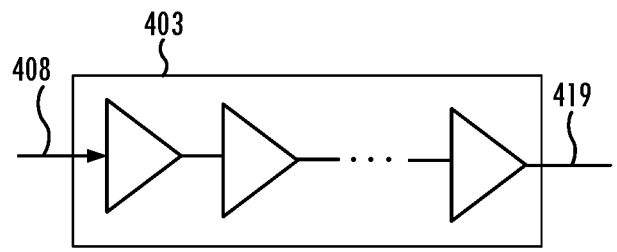
FIG. 4C illustrates an embodiment of a fixed delay circuit.

FIG. 4A illustrates an embodiment of a delay circuit 400 with a variable delay circuit 401 and a fixed delay circuit 403. Input selector circuit 405 (shown as a multiplexer) selects the input signal 407 initially as output signal 408 of the input selector circuit. In the embodiment of FIG. 4A, the active edge of the input signal is a rising edge. The rising edge goes through the fixed delay circuit 403 that provides a loop delay and then counter 409 receives the rising edge which causes counter 409 to increment. Once the rising edge is detected by the control logic 411, the control logic 411 causes the input selector circuit 405 to select the feedback signal 420, which is the same signal as the output 419 of the fixed delay circuit 403 in the embodiment of FIG. 4A. Counter 409 tracks the number of loops needed to recirculate the input signal to achieve the desired coarse delay referred to herein as the loop delay. For example, using the previous example of a fixed delay of 20 ns for fixed delay circuit 403, the first rising edge seen by counter represents a loop delay of 20 ns, the second rising edge seen by counter 409 corresponds to a 40 ns delay and the third rising edge corresponds to a 60 ns recirculating delay. After the third rising edge, the control logic 411, based on the count value provided by the counter 409, switches the input selector circuit to receive the input signal instead of the feedback signal. In an embodiment, at least some functionality of the control logic 411 utilizes a finite state machine that utilizes detection of the first active edge and the count value to control the input and output selector circuits. In addition, while the recirculation is taking place to achieve the fixed delay of 60 ns with three loops through the fixed delay circuit, the control logic 411 controls the output selector circuit 415 (shown as a multiplexer) to select the output signal 417 of the output selector circuit, which is fed back as an input to the output selector circuit 415. Once the recirculation is complete the variable delay circuit 401 receives the output signal 419 from the fixed delay circuit and applies the variable delay to the output signal 419. In addition, once the recirculation is complete (counter reaches three for the 63 ps example), the control logic 411 causes the output selector circuit 415 to select the output signal 421 from the variable delay circuit 401, which in the illustrated embodiment is supplied through buffer circuit 423. In an embodiment, as shown in FIG. 4B, the fixed delay circuit can be bypassed and the rising edge supplied directly to the variable delay circuit when desired using, e.g., a bypass selector circuit 424 to supply the output signal 408 from the input selector circuit 405 directly to the variable delay circuit 401. FIG. 4C illustrates an embodiment of the fixed delay circuit 403 that uses process, voltage, and temperature (PVT) compensated buffers.

Figure 5:
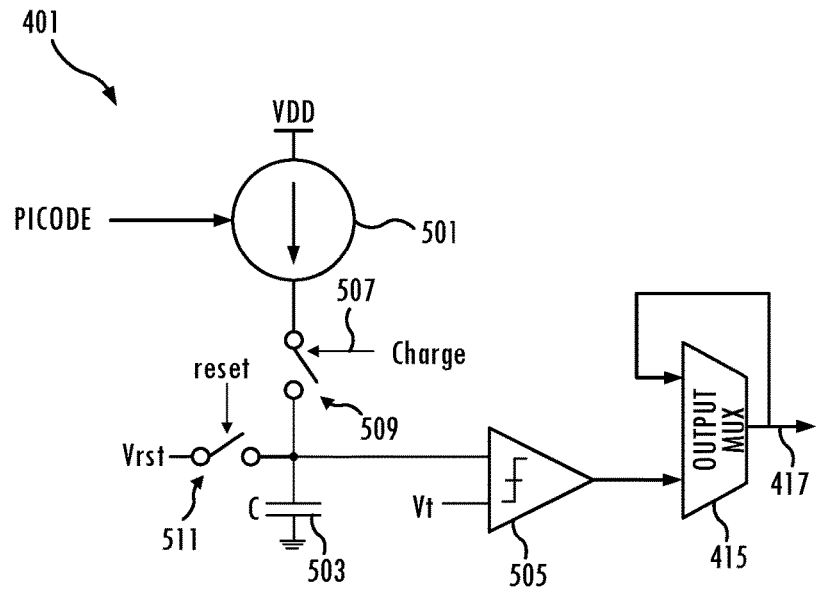
FIG. 5 illustrates an embodiment of a phase interpolator circuit used for the variable delay.

Referring again to FIG. 4A, in an embodiment, the variable delay circuit 401 implemented as a phase interpolator circuit. A phase interpolator code (PICODE) specifying the variable delay is supplied to digital to analog converter (DAC) 425 that supplies an analog signal to the variable delay circuit 401 based on the PICODE. FIG. 5 illustrates an embodiment of a phase interpolator circuit implementing the variable delay circuit 401. The PICODE is supplied to a variable current source 501 that functions as a DAC that supplies a current having a magnitude corresponding to the digital PICODE. Note that while the DAC is shown separately in FIG. 4A to better illustrate concepts related to the PICODE, the DAC 425 (shown as variable current source 501 in FIG. 5) can be considered part of the variable delay circuit 401. The current from the variable current source 501 charges the capacitor 503, and the voltage across the capacitor 503 ramps up until it reaches the threshold voltage Vt, which is supplied to comparator 505 along with the capacitor voltage. When the comparator indicates the charging level of the capacitor is above Vt, the rising edge of the output waveform is supplied by the output selector circuit 415 as the output signal 417. The capacitor starts ramping when the signal "charge" 507 closes switch 509 responsive to the rising edge of the signal 419 supplied from the fixed delay circuit 403 (see FIG. 4). In that way the rising edge is delayed first by the loop delay×N, where N is an integer controlling the number of loops determining how long the recirculation lasts and then by the variable delay. Note that the phase interpolator capacitor is reset to a reset voltage Vrst, e.g., a ground voltage before the ramp starts and Vrst is disconnected by switch 511 before or at the time the ramp starts.

Figure 6:
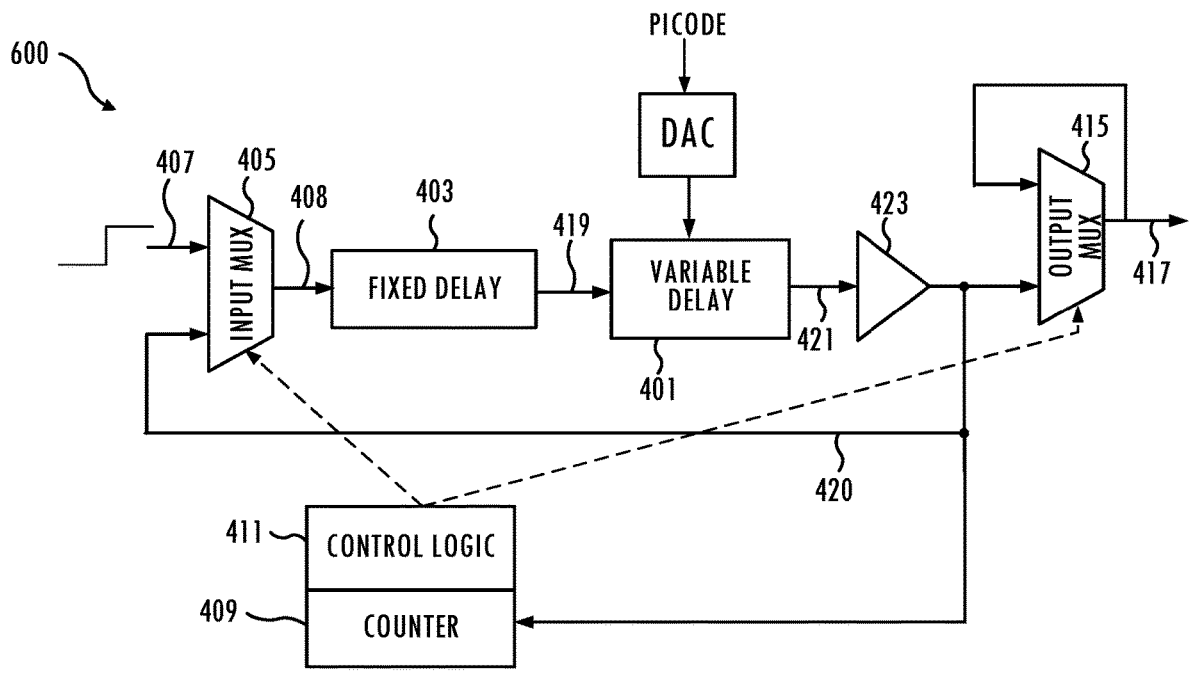
FIG. 6 illustrates an embodiment of a delay circuit in which the fixed delay circuit and the variable delay circuit combine to form the loop delay.

In FIG. 4A the fixed delay circuit 403 provides the loop delay. FIG. 6 illustrates another embodiment of a delay circuit 600 in which the fixed delay circuit and the variable delay circuit combine to form the loop delay. Thus, the feedback signal 420 to the input selector circuit 405 comes from the output of buffer 423. In an embodiment, the variable delay of the variable delay circuit 401 ranges up to a maximum of 25 ps. To implement the loop delay, the variable delay is set to a predetermined delay amount. In an embodiment, that delay is the maximum delay. In other embodiments, that delay is programmable based on the desired loop delay. Assume the fixed delay 403 is 20 ps and the variable delay is set to a delay of 10 ps to combine with the fixed delay for the loop delay. Assume the desired total delay is 63 ps. With a loop delay of 30 ps (20 ps+10 ps), two recirculating loops (30 ps for each loop) are utilized to achieve a recirculating delay of 60 ps. When counter circuit 409 reaches a loop count of two, control logic switches the PICODE to a code corresponding to 3 ps to implement the variable delay to thereby provide a total delay of 63 ps.

Figure 7:
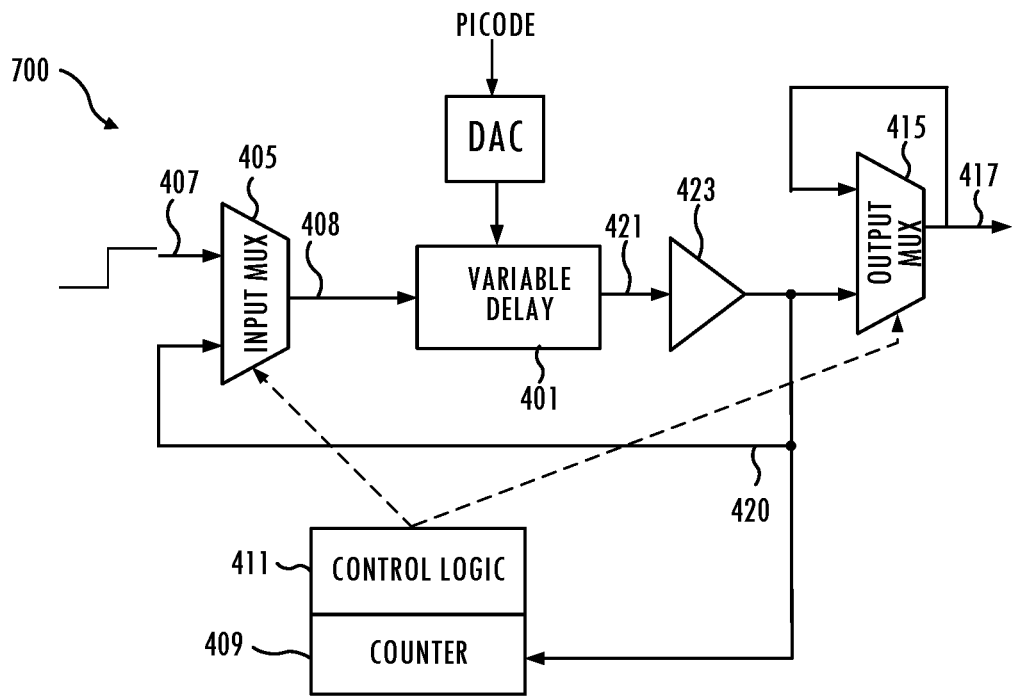
FIG. 7 illustrates an embodiment of a delay circuit in which the loop delay is provided entirely by the variable delay circuit.

FIG. 7 illustrates another embodiment of a delay circuit 700 in which the loop delay is provided entirely by the variable delay circuit 401 being set to a predetermined or programmable PI code. For example, to achieve a desired 63 ps total delay, the PICODE is set to a maximum variable delay value of 25 ps and after two loops for a total of 50 ps, the PICODE is set to 13 ps to provide a 13 ps variable delay to thereby provide a total delay through the delay circuit of 63 ps.

Figure 8:
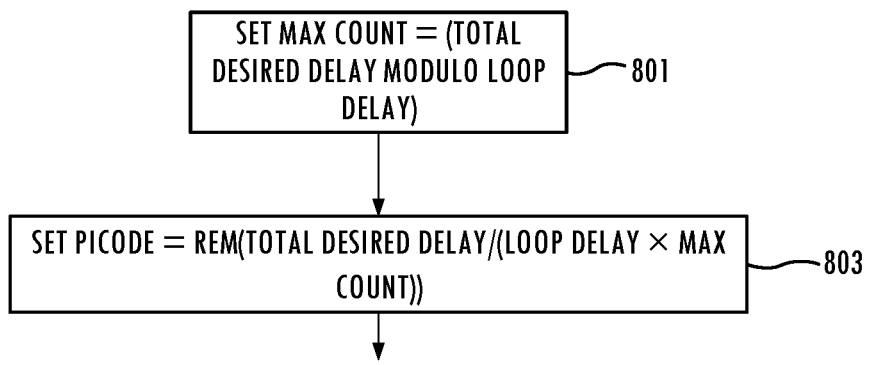
FIG. 8 illustrates control operations to determine the maximum count and phase interpolator settings.

FIG. 8 illustrates operations performed by control logic in FIG. 4. The control logic may be part of the control logic 411 or separate control logic implemented, e.g., in a programmed microcontroller or in dedicated digital logic or a combination of digital logic and programmed logic. In 801, the maximum count is set to the total desired delay modulo the loop delay. Depending on the particular embodiment, the loop delay may be provided by the fixed delay circuit 403, the fixed delay circuit 403 in combination with the variable delay circuit 401, or by the variable delay circuit 401 alone. With reference to FIG. 4, with a fixed delay of 20 ps, and a desired delay of 63 ps, the maximum count is set to 3. The control logic PICODE is then set in 803 to the remainder (total delay/(loop delay×maximum count)). For the example of 63 ps for the total delay and a maximum count of 3, the PICODE is set to correspond to 3 ps. The operations in FIG. 8 may be performed responsive to system changes such as insertion of line cards, temperature change, or periodically to account for voltage or temperature changes.

Figure 9:
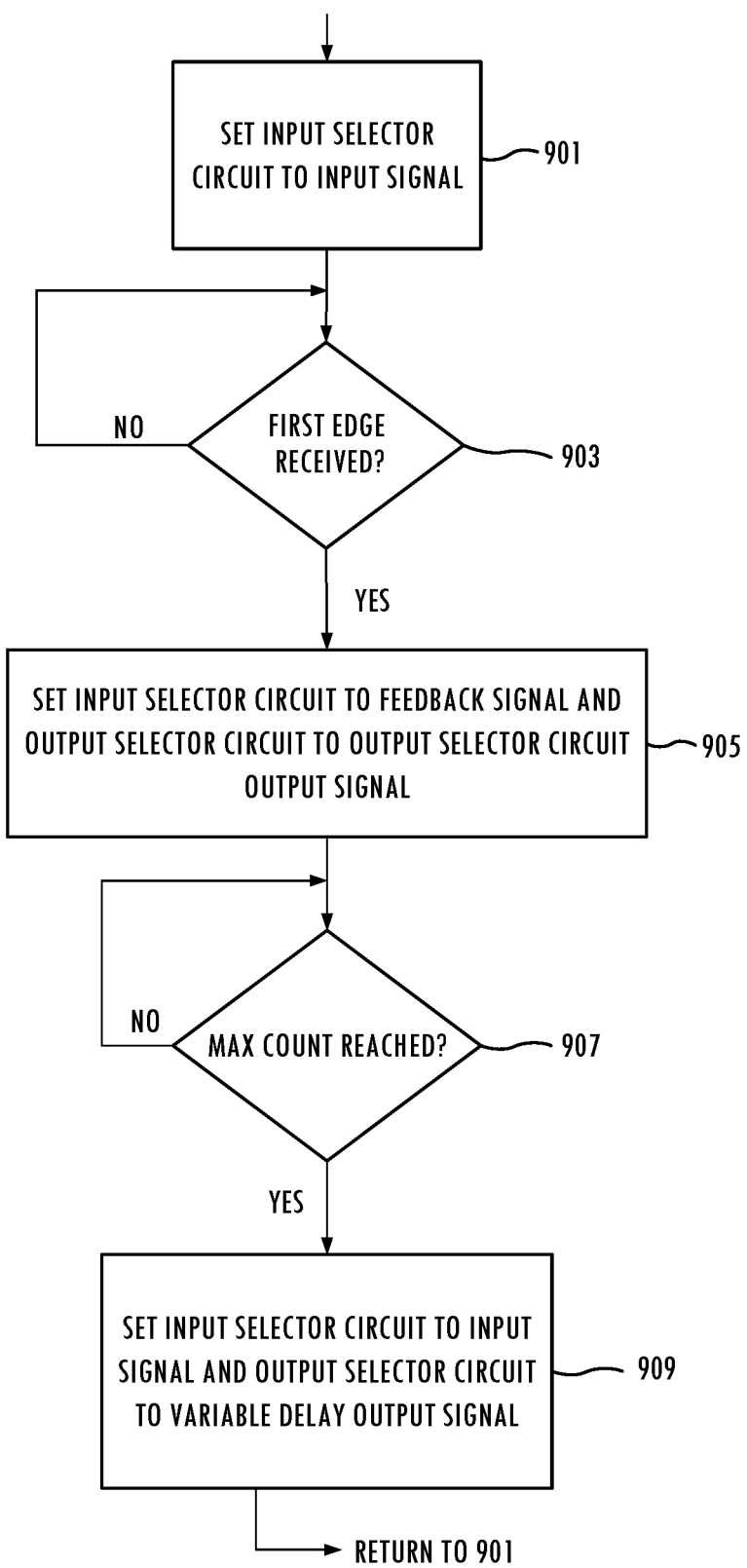
FIG. 9 illustrates a flow chart of the operation of the embodiment of delay circuit of FIG. 4A.

FIG. 9 illustrates a flow chart of the operation of the embodiment of delay circuit 400 shown in FIG. 4A. With reference to FIG. 9 and FIG. 4A, initially the control logic 411 sets the input selector circuit to select the input signal in 901. The control logic 411 then waits for a rising edge to be received in 903. Note that the control logic resets the counter by the start of the operation. Responsive to receipt of the first rising edge at the delay circuit using, e.g., an edge detector circuit not shown in FIG. 4A, the control logic in 905 causes the input selector circuit to select the feedback signal 420 so the rising edge recirculates through the fixed delay circuit. The control logic also causes the output selector circuit 415 to select the output signal 417. The counter 409 receives the rising edge, which causes the counter to increment for each rising edge seen. In 907, the control logic compares the current count value to the maximum count value and once the maximum count is reached, the control logic in 909 causes the input selector circuit to select the input signal 407 instead of the feedback signal 420 and the output selector circuit to select the variable delay output signal 421. The variable delay circuit then delays the rising edge by the variable delay and thus the signal with the total desired delay is supplied to the output 417 of the output selector circuit 415. The flow then returns to 901. In FIGS. 4A and 9 the total delay is achieved according to ((N×the loop delay)+the variable delay), where N is the max loop count and the loop delay is provided by the fixed delay circuit.

Figure 10:
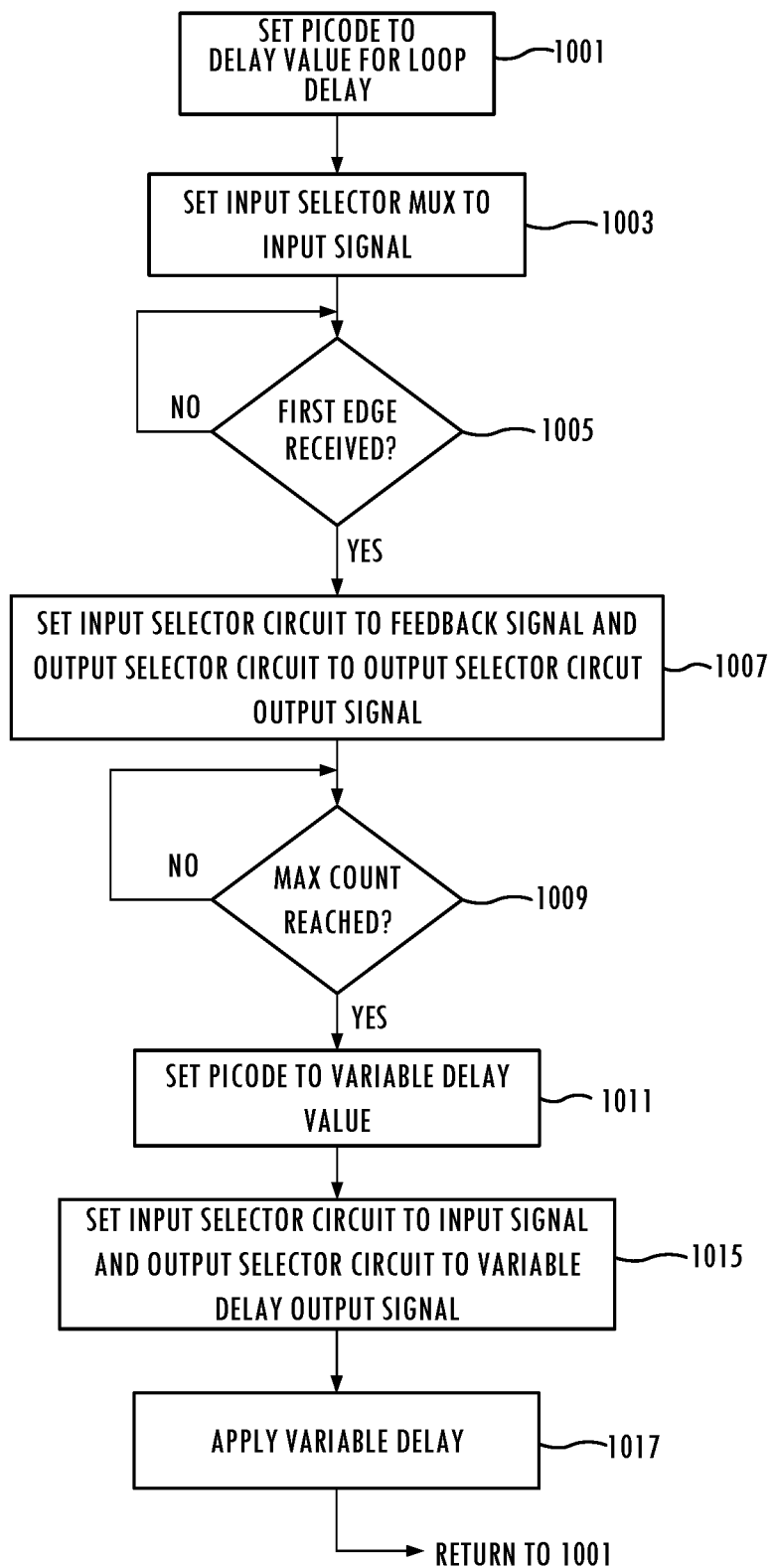
FIG. 10 illustrates a flow chart of the operation of the embodiment of delay circuit of FIG. 6.

FIG. 10 illustrates the operation of the delay circuit 600 shown in FIG. 6. With reference to FIGS. 6 and 10, the control logic sets the PICODE to the maximum delay value (or other desired delay value) in 1001 to set the desired loop delay. Remember, in FIG. 6, the variable delay is used to provide part of the loop delay. In 1003, the control logic causes input selector circuit to select the input signal. In 1005, the control logic looks for the first rising edge and then the control logic causes the input selector circuit to select the feedback signal 420 and the output selector circuit 415 to select the output signal 417. The counter 409 also receives the rising edge, which causes the count to increment for each rising edge seen. In 1009, the control logic compares the current count value to the maximum count value and once the maximum count value is reached, the control logic sets the PICODE to the variable delay PICODE value in 1011 and in 1015 the control logic causes the input selector circuit to select the input signal 407 instead of the feedback signal 420 and the output selector circuit to select the variable delay output signal 421. The variable delay circuit then provides the variable delay in 1017 and the signal after the total desired delay is supplied to the output 417. The flow then returns to 1001. In FIGS. 6 and 10 the total delay is achieved according to ((N×the loop delay)+the variable delay), where N is the maximum loop count and the loop delay is provided by the fixed delay circuit and the variable delay circuit with the variable delay circuit set to a predetermined value.

Figure 11:
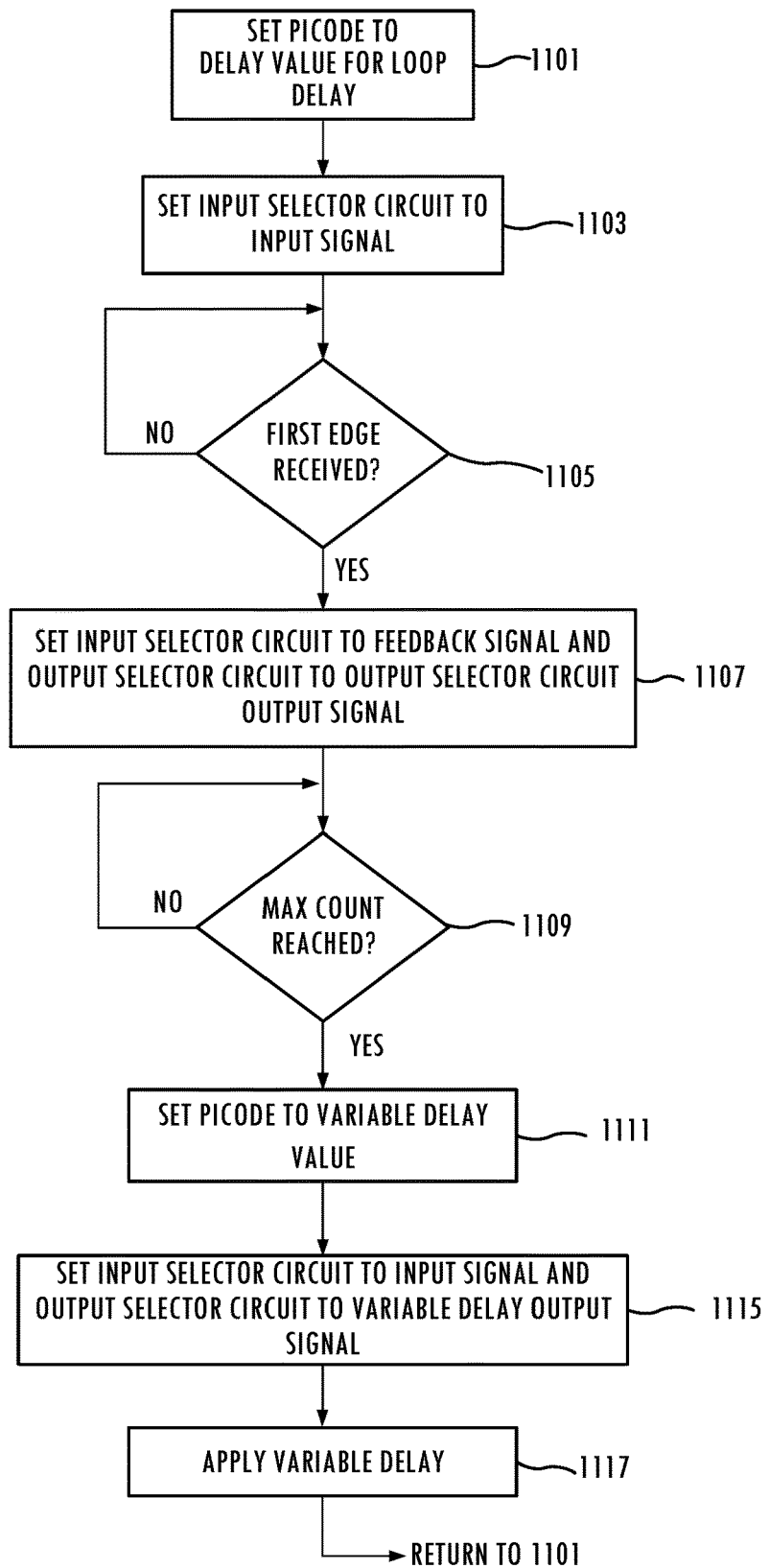
FIG. 11 illustrates a flow chart of the operation of the embodiment of delay circuit of FIG. 7.

FIG. 11 illustrates the operation of the delay circuit 700 shown in FIG. 7. With reference to FIGS. 7 and 11, the control logic sets the PICODE to the maximum delay value (or other desired delay value) in 1101. Remember, in FIG. 7, the variable delay is used to provide the loop delay. In 1103, the control logic causes input selector circuit to select the input signal. In 1105, the control logic looks for the first rising edge and then when the first rising edge is detected, the control logic in 1107 causes the input selector circuit to select the feedback signal 420 and the output selector circuit 415 to select the output signal 417. The counter 409 also receives the rising edge, which causes the counter to increment for each rising edge seen. In 1109, the control logic compares the current count value to the maximum count value and once the maximum count value is reached, the control logic sets the PICODE to the variable delay PICODE value in 1111 and in 1115 the control logic causes the input selector circuit to select the input signal 407 instead of the feedback signal 420 and the output selector circuit to select the variable delay output signal 421 supplied through buffer 423. The variable delay circuit then provides the variable delay in 1117 and the signal, after the total desired delay, is supplied to the output 417. The flow then returns to 1101. In FIGS. 7 and 11 the total delay is achieved according to ((N×the loop delay)+the variable delay), where N is the max loop count and the loop delay is provided by the variable delay circuit set to a predetermined value, e.g., a maximum value.

Thus, various embodiments of an output delay circuit have been described. The description of the invention set forth herein is illustrative, and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A delay circuit comprising:
an input selector circuit to select between a feedback signal and an input signal;
a loop delay circuit to provide a loop delay to the input signal and supply a loop delay output signal used as the feedback signal;
the input selector circuit being controlled to select the feedback signal during recirculation of the feedback signal;
a variable delay circuit to provide a variable delay to the loop delay output signal after the recirculation is complete and to supply a variable delay output signal; and
an output selector circuit to select between an output of the output selector circuit and the variable delay output signal,
the output selector circuit being controlled to select the output of the output selector circuit during the recirculation and to select the variable delay output signal after the recirculation is complete.

2. The delay circuit as recited in claim 1 further comprising
a control circuit to control the input selector circuit and the output selector circuit, the control circuit including a counter circuit to count a number of loops indicative of the recirculation.

3. The delay circuit as recited in claim 2 further comprising
a fixed delay circuit to provide at least a portion of the loop delay circuit.

4. The delay circuit as recited in claim 3
wherein a total delay is achieved according to ((N×the loop delay)+the variable delay), where N is an integer indicating a number of loops corresponding to the recirculation, and where N is determined by the total delay modulus the loop delay.

5. The delay circuit as recited in claim 3
wherein the loop delay is determined according to a first delay of the fixed delay circuit added to a second delay of the variable delay circuit, the second delay determined according to a delay setting of the variable delay circuit.

6. The delay circuit as recited in claim 1 wherein the loop delay is achieved, at least in part, by setting the variable delay circuit to a predetermined delay value.

7. The delay circuit as recited in claim 6
wherein the predetermined delay value is a maximum value of the variable delay circuit.

8. The delay circuit as recited in claim 1 wherein the variable delay circuit comprises a phase interpolator circuit.

9. The delay circuit as recited in claim 8 wherein the phase interpolator circuit further comprises
a digital to analog converter coupled to receive a phase interpolator code based on the variable delay and to supply an analog signal to control charge on a capacitance used to determine the variable delay.

10. A method for delaying an input signal comprising:
selecting the input signal in an input selector circuit;
recirculating the input signal in a loop delay circuit having a loop delay to generate a first delayed signal delayed by (N×the loop delay), N being an integer of 1 or more, the input selector circuit selecting a feedback signal instead of the input signal during the recirculating;
delaying the first delayed signal by a variable delay in a variable delay circuit to generate a second delayed signal;
selecting in an output selector circuit an output of the output selector circuit during the recirculating; and
after the recirculating is completed, selecting the second delayed signal as an output of the output selector circuit.

11. The method as recited in claim 10 further comprising using a counter circuit to count a number of loops to determine the recirculating.

12. The method as recited in claim 10 further comprising generating the second delayed signal using a phase interpolator circuit.

13. The method as recited in claim 12 further comprising
supplying a phase interpolator code based on the variable delay to a digital to analog converter and supplying an analog signal to control charge on a capacitor to delay for the variable delay.

14. The method as recited in claim 10 further comprising using a fixed delay circuit to provide for at least a portion of the loop delay.

15. The method as recited in claim 14 further comprising using the fixed delay circuit in combination with the variable delay circuit set to a predetermined delay, to provide for the loop delay.

16. The method as recited in claim 15 further comprising setting the predetermined delay to a maximum delay of the variable delay circuit.

17. The method as recited in claim 10 further comprising:
determining a total delay according to ((N×the loop delay)+the variable delay), when N is a number of loops of the loop delay, and where N is an integer of at least one;
determining N according to the total delay modulo the loop delay; and
determining the variable delay according to a remainder of (the total delay divided by (N×the loop delay)).

18. A delay circuit comprising:
an input selector circuit to select between a feedback signal and an input signal;
a fixed delay circuit coupled to the input selector circuit and configured to supply a fixed delay output signal, the fixed delay output signal being used as the feedback signal;
control logic to cause the input selector circuit to select the feedback signal during recirculation of the fixed delay output signal through the fixed delay circuit;
a variable delay circuit coupled to the fixed delay circuit to provide a variable delay to the fixed delay output signal after the recirculation is completed; and
an output selector circuit to select an output signal of the output selector circuit during the recirculation and to select an output of the variable delay circuit after the recirculation is complete.

19. The delay circuit as recited in claim 18 wherein the fixed delay circuit comprises a plurality of buffer circuits.

20. The delay circuit as recited in claim 4 wherein the variable delay is determined according to a remainder of the total delay divided by (N×the loop delay).

21. The delay circuit as recited in claim 4 wherein the input selector circuit selects the feedback signal responsive to the control circuit indicating the number of loops has not been completed.

22. The delay circuit as recited in claim 4 wherein the input selector circuit selects the input signal responsive to the control circuit indicating the number of loops has been completed.

23. The delay circuit as recited in claim 4 wherein the output selector circuit selects the output of the output selector circuit responsive to the control circuit indicating the number of loops has not been completed.

24. The delay circuit as recited in claim 4 wherein the output selector circuit selects the output of the variable delay circuit responsive to the control circuit indicating the number of loops has been completed.

25. The delay circuit as recited in claim 5 wherein a total delay is achieved according to (N×(the first delay+the second delay)+the variable delay), when N is the number of loops.

26. The delay circuit as recited in claim 5 further comprising a bypass selector circuit coupled to supply to the variable delay circuit either a first output signal of the fixed delay circuit or a second output signal of the input selector circuit.

* * * * *